United States Patent [19]

Siu et al.

[11] 3,982,811
[45] Sept. 28, 1976

[54] ELECTRICAL TERMINAL

[75] Inventors: Bernard K. Siu; Richard D. Allemang, both of Cedar Rapids, Iowa

[73] Assignee: Rockwell International Corporation, El Segundo, Calif.

[22] Filed: Sept. 22, 1975

[21] Appl. No.: 615,277

[52] U.S. Cl. ............................. 339/105; 174/68.5; 174/166 S; 317/101 CC; 339/276 A
[51] Int. Cl.² .......................................... H01R 13/58
[58] Field of Search ........... 339/105, 103 R, 103 M, 339/221, 276 R, 276 T, 276 A, 95 R, 95 D, 17 C; 174/68.5, 166 S; 317/101 CC

[56] References Cited
UNITED STATES PATENTS

| | | | |
|---|---|---|---|
| 2,857,579 | 10/1958 | Scanlon | 339/105 |
| 2,940,016 | 6/1960 | Flint et al. | 174/166 S |

*Primary Examiner*—Roy Lake
*Assistant Examiner*—DeWalden W. Jones
*Attorney, Agent, or Firm*—Terry M. Blackwood; Robert J. Crawford

[57] ABSTRACT

A post type electrical terminal having at one end at least one channel for receiving electrical wires. This channel follows a nonlinear path so as to impose a bend in any wire inserted therein.

12 Claims, 4 Drawing Figures

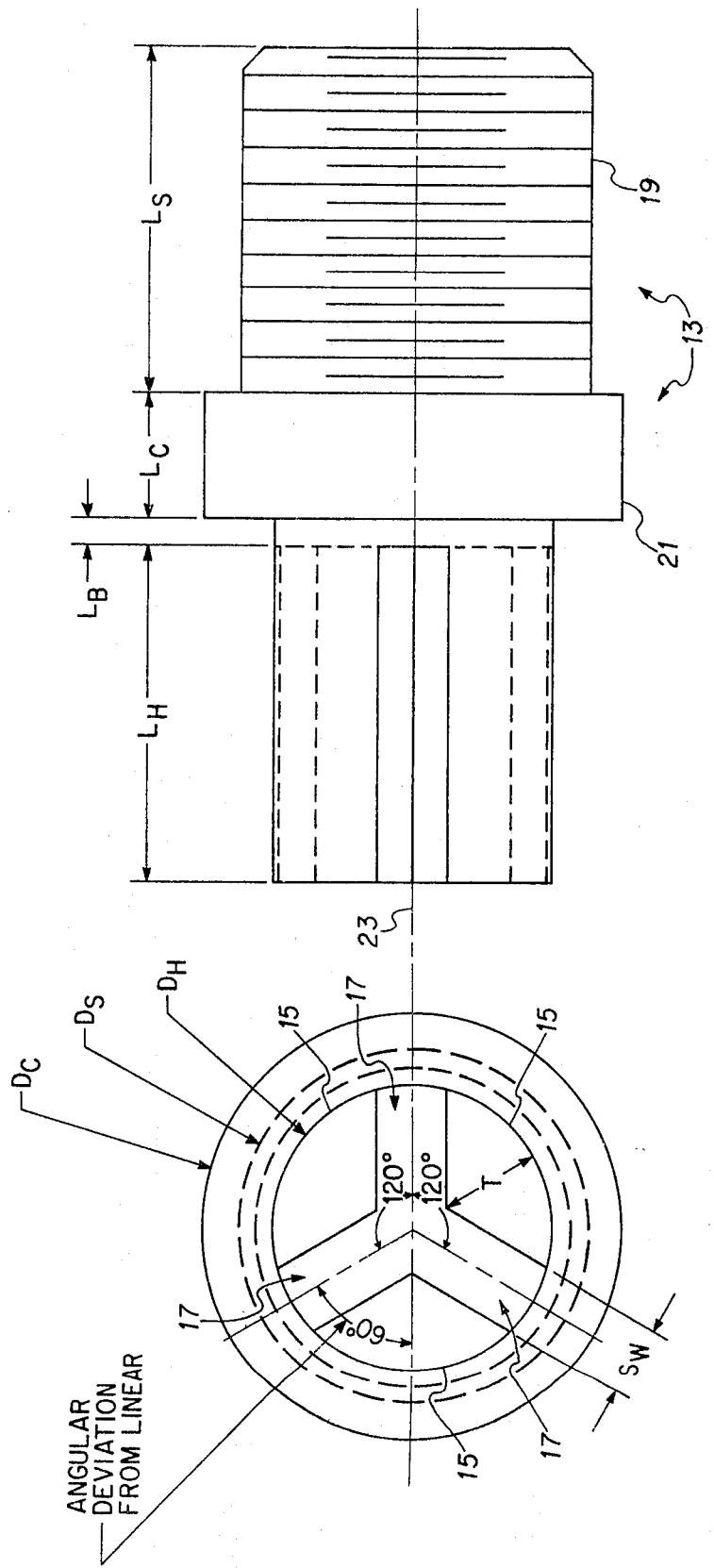

ELECTRICAL TERMINAL

The present invention relates, generally, to electrical terminals and more specifically to connecting post type electrical terminals.

Electronic circuits are commonly assembled by soldering electronic component lead wires to post type terminals which themselves are mechanically secured to a board or panel or the like. One of the most commonly used post type terminals resembles a miniature cylinder, the bottom end of which is designed for mounting on and to an appropriate surface, and the top end of which contains a single straight slot cut along a diameter of the cylinder. The slot is accommodatingly wide and deep to receive one or more lead wires and eventually the post and wire are permanently connected together, both electrically and mechanically, by soldering. Variations of this basic scheme include relatively flat posts fashioned from sheet metal or the like and which resemble an open-end lug. For instance see U.S. Pat. No. 3,248,687 to Immel.

Such terminals are not desirable for many applications since they limit speed and ease of assembly, especially when high component concentration is required. For instance, after placement of a first lead wire into a terminal slot, but before placing a second lead thereinto, it is customary to temporarily mechanically secure the post and first lead wire together to prevent any movement of the lead in the terminal which, of course, could be caused by subsequent assembly movements. Such temporary mechanical connection is especially required to prevent toppling when the center of gravity of a component, especially a two lead component, is above the level of the slot. Also, such temporary mechanical connections are required if it is desired to manufacture by a series of progressive operations.

This temporary mechanical support or connection is usually accomplished either by bending the lead with pliers back around the terminal post or by tack soldering the lead and post together. Such a temporary connection is generally made for each lead going to the terminal and only after each is in place is the final and permanent soldering performed. Additionally when it is desired or required to cover the end of the lead with solder, each lead must first be cut before tack soldering, and thus an additional tool handling operation is required. Furthermore, the rotational orientation of the terminal must be considered and planned for so that when the terminal is installed in the panel, the slots are appropriately aligned with the component leads coming thereto. Thus it is seen that a great deal of assembly labor and use of hand tools such as cutters, pliers, and/or soldering irons is required when this type of prior art terminal is employed in electronic assembly.

In accordance with the present invention, a novel post type electrical terminal facilitates electronic assembly by obviating or reducing use of hand tools in accomplishing the above-described temporary mechanical connection. Said novel terminal takes advantage of bending resistance inherent in lead wires and permits the making of a temporary, yet secure, mechanical connection by an assembler using in many cases only his hands and fingers. An especially preferred embodiment further eliminates rotational orientation problems.

These and other features, objects, and advantages of the invention will become more apparent upon reference to the following specification, claims, and appended drawings in which:

FIGS. 3 and 4 are, respectively, top and side views of the presently preferred terminal embodiment.

Figure 1:
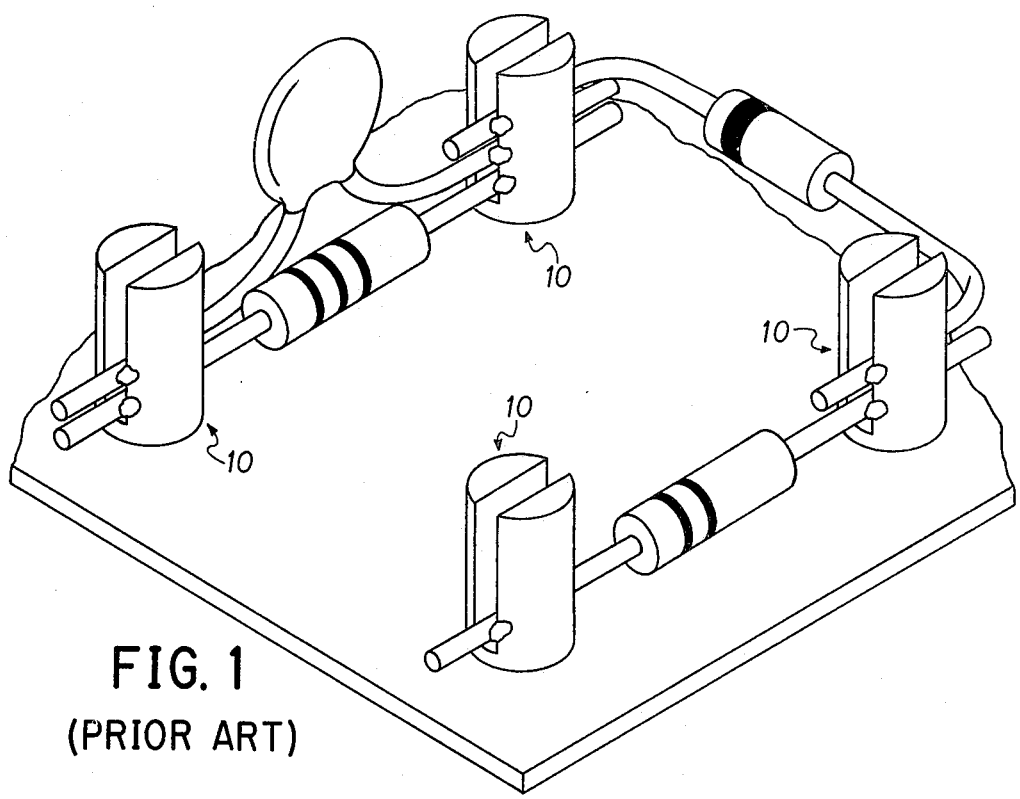
FIG. 1 illustrates a prior art post type terminal as employed in a typical electronic assembly.

FIG. 1 illustrates the general nature of the hereinabove-described problems which are encountered with the prior art post type terminals 10. As seen from FIG. 1, the prior art post having a single straight slot provides insufficient mechanical support for the components prior to final soldering and thus, especially when vertically stacking components to achieve high component concentration or density, or when preparing the assembly for progressive operations, it is apparent that the component leads must either be tack soldered (as illustrated) or plier wrapped around the terminals 10 to provide the necessary interim mechanical support. As additionally seen from FIG. 2, it is important that the slots be appropriately aligned.

Figure 2:
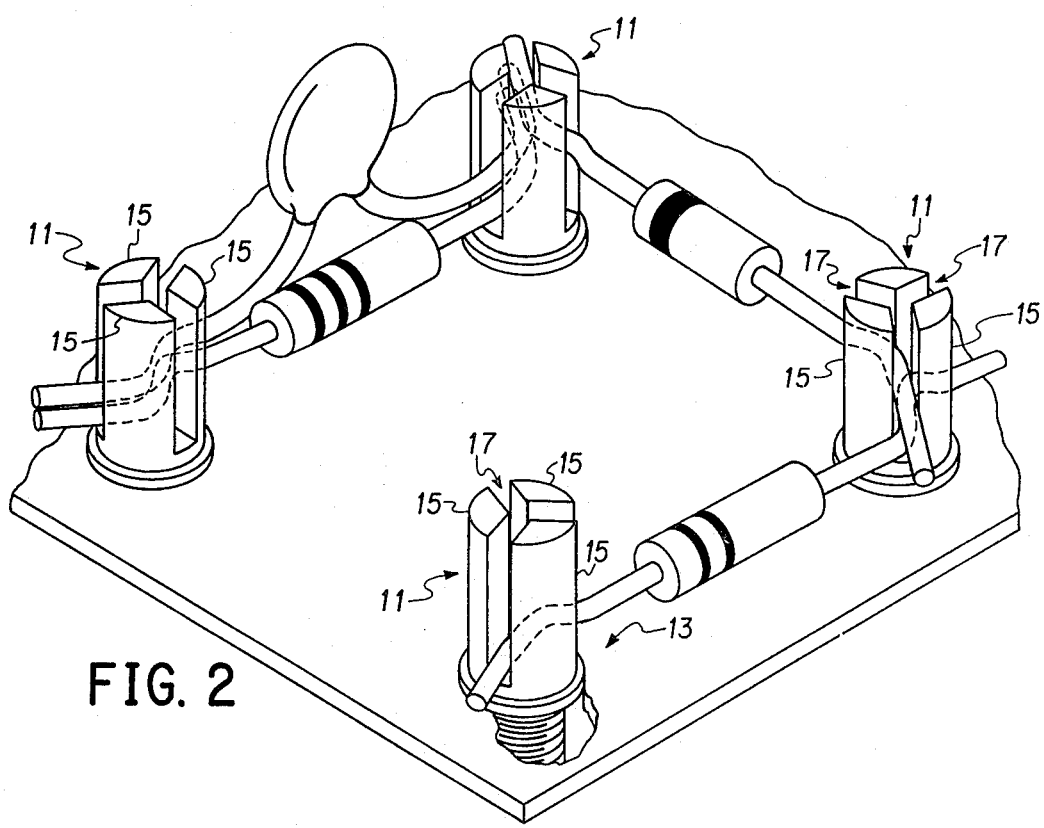
FIG. 2 illustrates the present preferred electrical terminal embodiment of this invention as employed in an assembly analogous to that shown in FIG. 1.

In FIG. 2, there is illustrated the presently preferred embodiment of this invention being employed to achieve the same electrical connections as shown in FIG. 1. In general it is seen that the preferred embodiment of terminals 11 comprises a main body 13, substantially cylindrically shaped, from which three legs 15, unitary with the body 13, protrude so as to define three substantially radially oriented slots 17 which are in communication, and more particularly joining, with one another at or near the central axis of the cylinder. The pattern of slots may be described generally as a Y shaped pattern. More particularly, the legs 15 of the presently preferred embodiment, which is shown in more detail in FIGS. 3 and 4, are substantially identical to one another and symmetrically located about the cylindrical axis, and in the particular Y pattern thereby defined, the three slots 17 are substantially equiangularly disposed about the center or junction of the Y pattern. Also, any two slots define a continuous channel capable of receiving a lead wire and thus, since there are three different combinations of three variables taken two at a time, there are three different continuous channels in the terminal.

Referring again to FIG. 2, two significant characteristics should be noted. Firstly, the entire assembly illustrated therein may normally be accomplished without any use whatsoever of hand tools. Secondly, a mechanical connection is achieved adequate to hold the components temporarily in place and no additional mechanical securing is required prior to final soldering. In general, the continuous channels formed by the preferred "equiangular Y" pattern of slots normally do not require lead wire bending severe enough to require pliers and yet follow paths sufficiently nonlinear to provide automatic retention of the lead wires. More particularly the lead wires may in most instances be worked with fingers only so as to substantially comply with, and lie in, one of the nonlinear channels through the terminal. Further, when the lead wire is lying in a channel formed by two of the slots, the natural resistance of the lead wire to bending causes a wedging effect and creates sufficient friction between the legs 15 and the wire to achieve a temporary mechanical connection. The connection achieved is sufficient to retain the components even when the assembly workpiece is inverted. Moreover, because the lead wire is not limp, like for example string, the bend creates resistance to movement along the axis of either bent section of lead wire.

Turning now to FIGS. 3 and 4, the presently preferred terminal embodiment is constructed from brass and the body portion 13 includes, for purposes of mounting to a panel through mounting holes therein, threaded stud portion 19 and a central enlarged collar portion 21. It should be apparent that other materials and panel mounting details may be selected without departing from the scope of this invention. In fact development is presently under way to provide the terminal with panel mounting means, such as a press-fit mount, which is more suited to rapid machine type installation.

Further evident as preferred characteristics from FIGS. 3 and 4 and the table below, the three slots 17 are evenly distributed at 120° intervals about the cylinder axis 23, are each wide enough to accommodate lead wires of most common components, and are each deep enough to accommodate about four lead wires per terminal. The various dimensions of a representative terminal which has actually been constructed are listed in the table below.

|       | Inches |       | Inches |
|-------|--------|-------|--------|
| $D_C$ | .130   | $L_H$ | .140   |
| $D_S$ | .112   | $L_B$ | .010   |
| $D_H$ | .098   | $L_C$ | .050   |
| $S_W$ | .035   | $L_S$ | .150   |
| $T$   | .029   |       |        |

It should be pointed out that other embodiments, which vary from the preferred embodiment, can also provide automatic lead retention and permit much "fingers only" assembly. For instance, these two novel results may be provided by a terminal with at least one continuous nonlinear channel which requires an appropriate bend in the lead wire. (The term nonlinear as used herein includes 'piecewise linear' or 'curved' or the like.) One such embodiment could resemble the preferred terminal but have only two of the three slots and thus only one continuous channel through such modified terminal. It should also be noted that channels imposing lead wire deviations from linear, other than the substantially 60° deviation from linear imposed in the preferred embodiment, may be employed. More particularly it has been determined that to obtain an adequate "automatic" temporary mechanical connection and to simultaneously reduce tool handling, an angular deviation from linear within the range of approximately 15° to approximately 75° is preferable.

Continuing, another modification might incorporate a Y pattern not centered on some axis of symmetry, or a Y pattern where the slots are not equiangularly disposed. Another modification of the preferred embodiment might have six substantially equiangularly spaced radial slots such that the slot arrangement resembled two opposing preferred "equiangular Y" patterns cocentered on the same terminal. Yet another modification might have five substantially equiangularly spaced radial slots. Furthermore, in a multiple channel arrangement, all slots might not join or otherwise communicate.

However the preferred embodiment is considered a highly optimized embodiment for various reasons. Firstly, when installing the terminals on a panel or board, little or no planning or care is required to properly orient the terminal rotationally. For some embodiments, such as one having only one continuous channel in the terminal, care must be taken to assure appropriate channel alignment with the component leads coming toward the terminal. With the preferred "equiangular Y" configuration, practically any rotational orientation is satisfactory for assembly.

Secondly, the preferred terminal retains good structural strength in the legs while taking up a minimum amount of panel "real estate". More particularly, as the number of slots increase beyond that of the preferred embodiment, or if equiangular distribution, or symmetry or central location of the Y pattern is not maintained, the amount of material remaining in one or more legs becomes less and the leg strength decreases unless the terminal diameter is increased. In some instances of high component density a larger diameter terminal may not be practical.

Thirdly, the preferred embodiment is substantially foolproof in the sense that assembly errors are practically impossible. That is, the terminal leaves the assembler little or no choice in installing the lead. With, say, an equiangularly disposed six slot arrangement an inexperienced assembler might attempt to overbend the lead (i.e., bend it back so that it deviates from linear by approximately 120°), thus creating a need for pliers and also a higher risk of lead breakage. Or an inexperienced assembler might not even bend the lead at all and insert the lead in a prior art, straight-across manner.

Thus, while a particular and highly preferred embodiment of the present invention has been shown and/or described, it is apparent that changes and modifications, some of which are brought out above, may be made therein without departing from the invention in its broader aspects. The aim of the appended claims, therefore, is to cover all such changes and modifications as fall within the true spirit and scope of the invention.

What is claimed is:

1. A conductive terminal comprising:

a. a body portion having an axis of symmetry,
   b. three substantially equal length legs unitary with said body portion and protruding therefrom substantially parallel to said axis, and
   c. three substantially straight slots, each defined by two different ones of said three legs, said three slots joining near said axis and radiating outward to the side of said terminal.

2. A terminal as defined in claim 1 wherein said three legs are substantially identical to one another and located symmetrically about said axis.

3. A terminal as defined in claim 2 wherein the slotted end of said terminal is substantially cylindrical.

4. A post type electrical terminal having at one end at least three slots in communication with one another and disposed in accordance with a substantially Y shaped pattern such that any two slots of said three form a continuous channel in said terminal capable of receiving one or more wires of the electronic component lead wire type.

5. A terminal as defined in claim 4 wherein said three slots are substantially equiangularly disposed about the junction of said Y pattern.

6. A terminal as defined in claim 5 wherein the slotted end of said terminal has an axis of symmetry and the junction of said Y pattern is substantially located on said axis of symmetry.

7. A terminal as defined in claim 6 wherein the maximum number of slots is three.

8. A terminal as defined in claim 7 wherein at least the slotted end of said terminal is substantially cylindrical.

9. A post type electrical terminal having at one end at least one channel for receiving electrical wire, said channel following a nonlinear path such that said wire, in order to substantially comply with said nonlinear path and lie in said channel, must be bent so as to deviate from linear more than 0° but less than 90°.

10. A terminal as defined in claim 9 wherein said channel follows a nonlinear path such that said wire must be bent so as to deviate from linear more than approximately 15° but less than approximately 75°.

11. A terminal as defined in claim 10 wherein said channel follows a nonlinear path such that said wire must be bent so as to deviate from linear approximately 60°.

12. A terminal as defined in claim 9 wherein said channel comprises at least two substantially straight, noncolinear slots in communication with one another.

* * * * *